United States Patent [19]

Navarro

[11] Patent Number: 4,728,220
[45] Date of Patent: Mar. 1, 1988

[54] JOINT FOR RAILS

[76] Inventor: Bernard J. Navarro, 3252 E. Chevy Chase Dr., Glendale, Calif. 91206

[21] Appl. No.: 894,416

[22] Filed: Aug. 8, 1986

[51] Int. Cl.⁴ ............................................. F16B 7/18
[52] U.S. Cl. ...................................... 403/118; 403/343
[58] Field of Search .......................... 409/11, 10, 12; 74/89.15, 424.8 R, 424.8 B; 238/218, 227, 228; 403/43, 44, 45, 46, 47, 48, 343, 118

[56] References Cited

U.S. PATENT DOCUMENTS

| | | | |
|---|---|---|---|
| 224,207 | 2/1880 | Merriman | 403/48 |
| 1,122,649 | 12/1914 | Sears | 74/424.8 R |
| 1,820,409 | 8/1931 | Trbojevich | 409/12 |
| 2,822,199 | 2/1958 | Johnson | 403/45 |
| 3,906,552 | 9/1975 | Weber | 403/343 X |
| 4,516,303 | 5/1985 | Kloster | 74/89.15 X |
| 4,586,392 | 5/1986 | Nilsson | 74/89.15 |
| 4,588,336 | 5/1986 | Navarro | 409/12 |

Primary Examiner—Andrew V. Kundrat
Attorney, Agent, or Firm—Jessup, Beecher & Slehofer

[57] ABSTRACT

A coupling member or joint is provided with a projecting lead screw adapted to be threaded into a tapped bore of a structural member. The lead screw is rotated by a worm operated exteriorly of the coupling member by a suitable wrench. A pair of such lead screws projecting oppositely along a given axis adapt the joint particularly for coupling aligned rails.

5 Claims, 7 Drawing Figures

JOINT FOR RAILS

BACKGROUND OF THE INVENTION

1. Field of Invention:

This invention relates to a joint for coupling end-to-end a pair of elongate rails.

2. The Problem:

Concrete cutting machinery typically operates on a rail or rails which must be transported to the locale or structure where the concrete is to be cut. Often the machinery must span a considerable linear distance. The transport of very long rails, at times, constitutes a serious problem to the portability and use of the concrete cutting equipment.

Accordingly, it is desirable to transport the rails in short, more wieldy sections. On site, the rails must be carefully aligned and firmly linked together in order to provide a proper and adequate transit path for the machinery.

The object of this invention is to provide a coupling link or member which expeditiously and firmly links together two aligned rails so that the cutting machinery may pass smoothly and without bumps from one rail to the next.

THE DRAWINGS

A preferred form of the present invention is illustrated wherein.

THE PREFERRED EMBODIMENT

Figure 1:
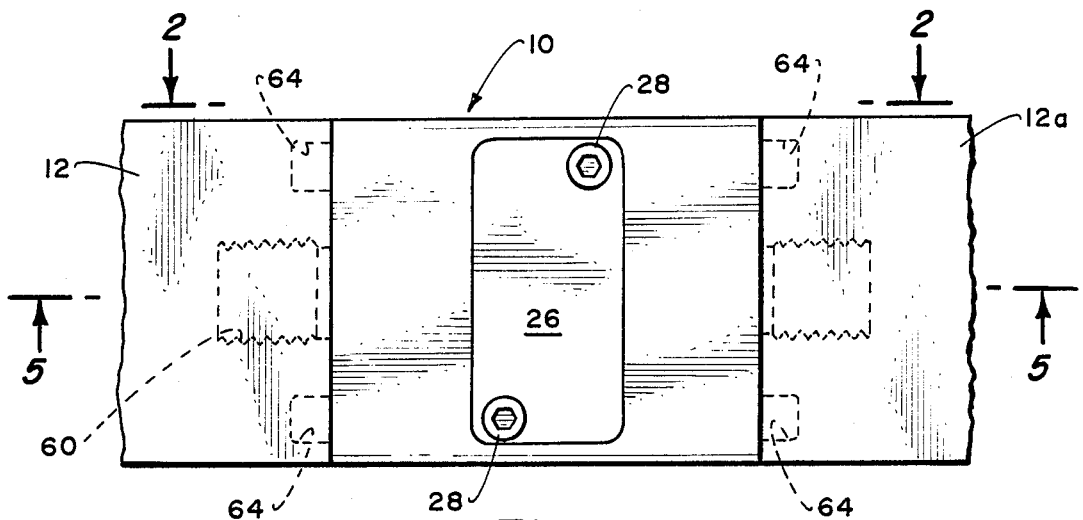
FIG. 1 is a side view showing the coupling joint linking two aligned elongate rails. Typically, the rails are temporarily mounted, either horizontally or vertically, to a concrete wall which is to be cut.
Figure 2:
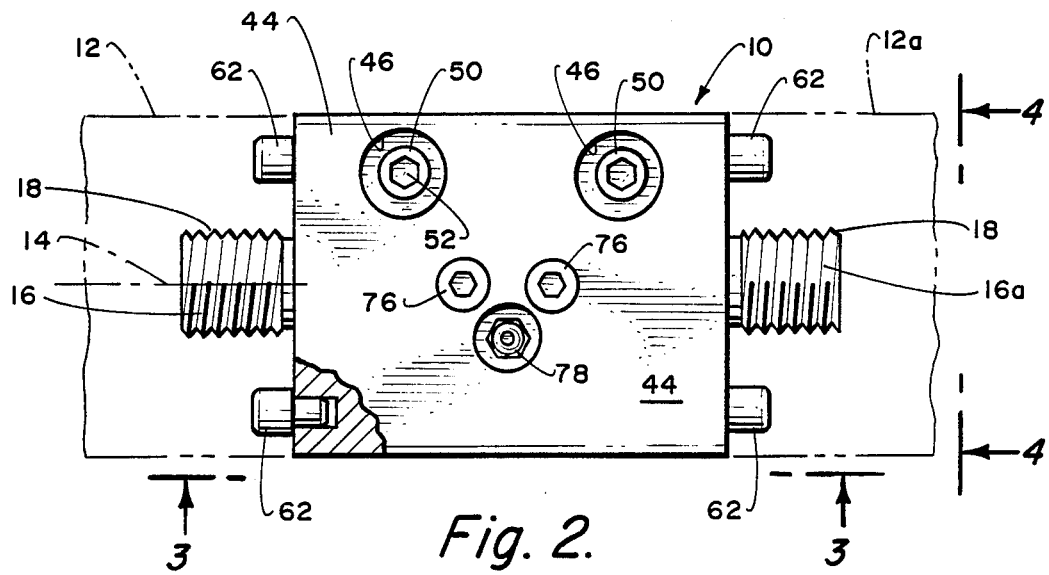
FIG. 2 is a side view taken on line 2—2 of FIG. 1.
Figures 3, 4:
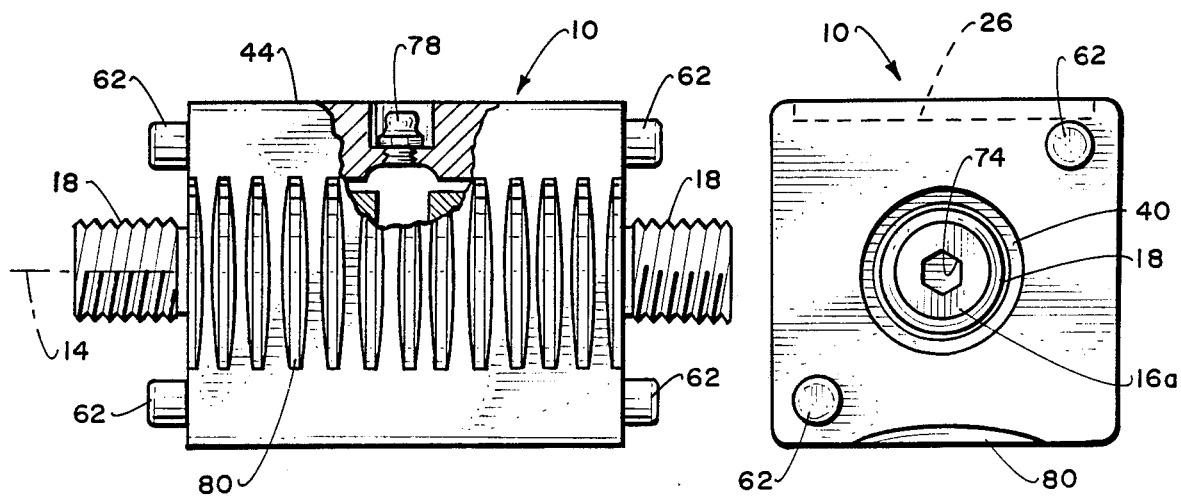
FIG. 3 is a side view taken on line 3—3 in FIG. 2.
FIG. 4 is an end view of the coupling joint taken on line 4—4 in FIG. 2.
Figure 5:
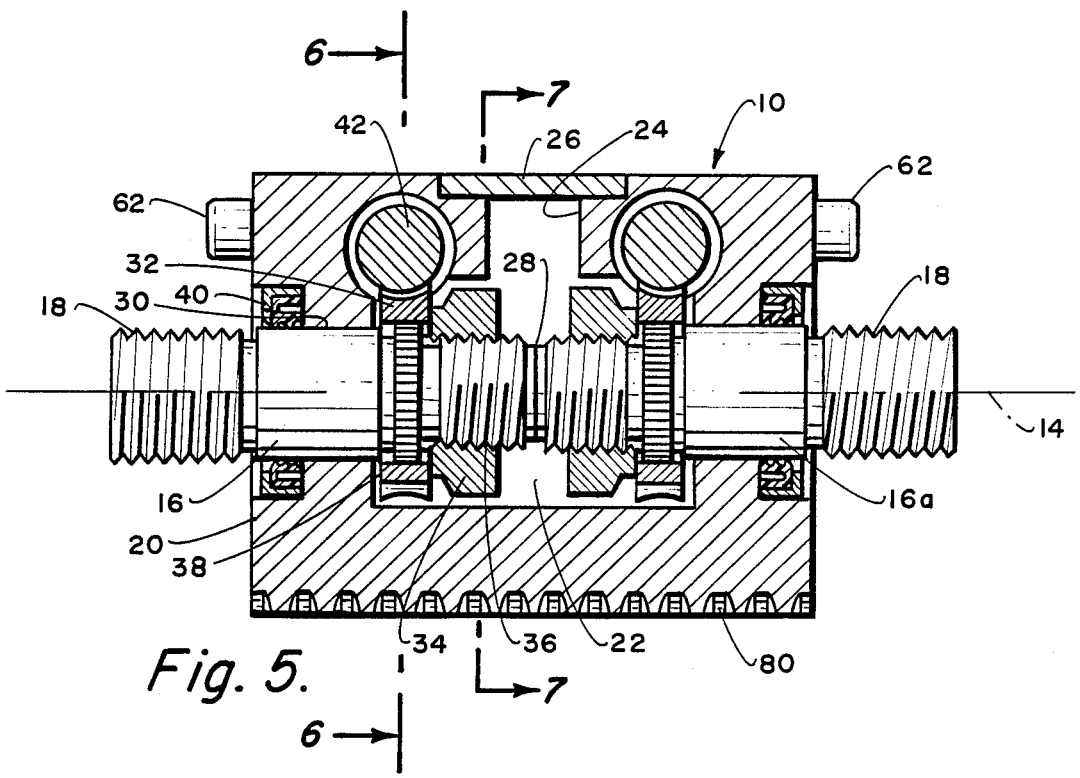
FIG. 5 is an elevational section taken on line 5—5 in FIG. 1.

Referring to the drawings, the coupling member or joint comprises a body 10 located between, and joining, aligned rails 12 and 12a. Journaled in body 10 on the axis 14 of the rails 12/12a is a pair of opposite projecting lead screws 16 and 16a. The lead screw 16a and its associated cooperating parts are substantially a mirror image of 16. It will be understood that the description which follows, while relating to the lead screw 16 on the left side of the figures, also applies to the right side of FIG. 5, where the lead screw 16a emerges. The outer end 18 of the lead screw 16 projects outwardly beyond an end face 20 of the body 10 and is threaded as shown at 18. The inner end of the lead screw 16 resides in a cavity 22, to which access is gained for assembly and maintenance through an access opening 24, closed by a cover plate 26 held in place by screws 28.

The inner ends of the respective lead screws 16 and 16a butt together at 28 and thus form thrust bearings for each other; i.e., the lead screw 16a forms a thrust bearing for the lead screws 16 inhibiting rightward movement (FIG. 5) to the latter, and vice versa. Splined at 30 to the lead screw 16 is a worm gear 32 held in place by a retention nut 34 threaded to 16 at 36. The worm gear 32 forms a thrust bearing at the face 38 of the gear hub inhibiting leftward movement of the lead screw 16. A seal 40 at the end face 20 circumjacent the lead screw 16 forms an oil seal preventing escape of lubricant from the cavity 22 and also seals the mechanism against the entry of outside contaminants.

Figure 6:
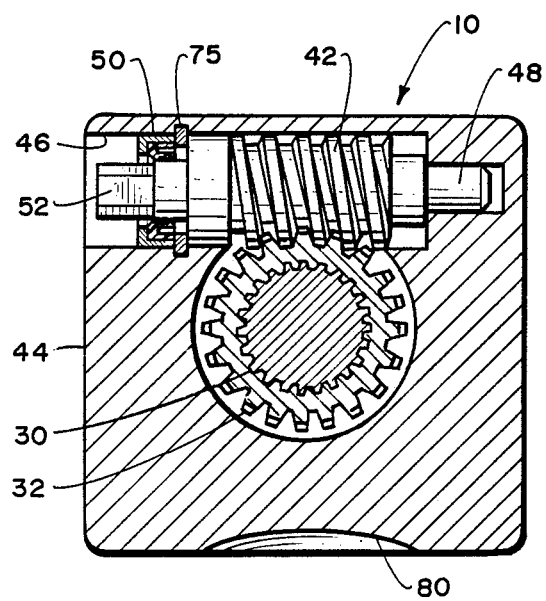
FIG. 6 is a cross section taken on line 6—6 in FIG. 5.
Figure 7:
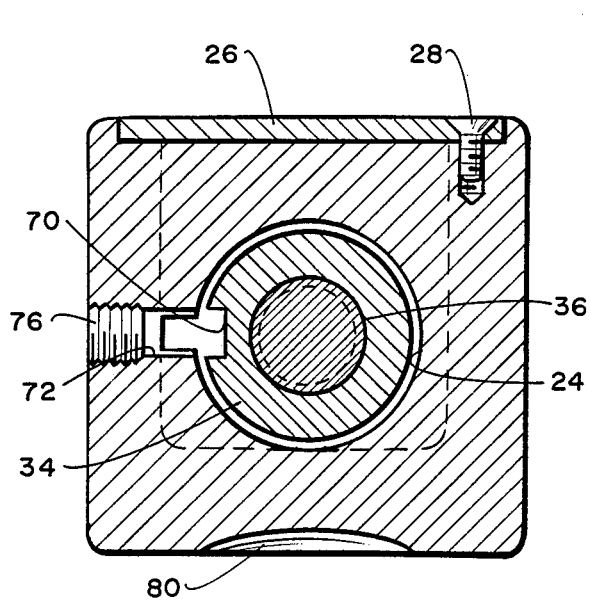
FIG. 7 is a cross section taken on line 7—7 in FIG. 5.

Meshing with the worm gear 32 is a worm 42, which emerges at a side face 44 (FIG. 6) of the body 10 into a recess or socket 46 formed in the face 44. The inner end of the worm 42 is journaled at 48 in the body 10 and the outer end is journaled in a seal 50 where the worm emerges into the socket 46. The outer end of the worm terminates in a non-circular head in the form of a hexagon 52, which stops short of the side face 44, so that the worm 42 is completely recessed inside the outer periphery of the body 10.

A dowel-and-socket arrangement, consisting of dowels 62 projecting from the end face 20 of body 10 which engage corresponding sockets 64 in the end face of the rail 12, prevents relative rotation between the body 10 and the rail 12.

In use, the coupling is screwed into one of the rail ends 12 until the dowel pins 62 interfere with further turning. Then the worm 42 is turned, by an appropriate socket wrench applied at 52, to the desired tension. Then the other rail 12a is similarly screwed into the other end of the coupling and tightened with the other worm 42.

In a specific structure constructed in accordance with this preferred embodiment, the lead screw 16 was provided at 18 with 9 threads per inch; the worm gear 30 which engaged the single thread worm 42 had 20 teeth. In this structure 5 foot lbs of torque applied to the worm 42 through the hex head 52 produced 1000 lbs of tension on the lead screw 16, thereby holding the joint body 10 in firm abutment against the end face of the rail 12.

To assemble the coupling member, access is gained through the access opening 24 to allow the gear 32 and retention nut 34 to be applied over the inner end of the lead screw 16. The tightening of the retention nut 34 is achieved by forming a notch 70 in the periphery of the nut. Aligned with the notch is an access opening 72, through which a locking instrument may be inserted into the notch 70. The lead screw 16 is then rotated by means of a hexagonal socket 74 in the external end face of the lead screw 16, to tighten the nut 34 firmly against the worm gear 32. Thereafter the worm 42 is inserted into place and held in by a retaining ring 75 and the seal 50. After assembly the access opening 72 is closed by a pipe plug 76. Lubrication of the gearing is effected by injecting lubricant through a zerk fitting 78.

The rails 12/12a are provided with rack teeth in order to enable controlled movement of the concrete cutting machinery along the rails. Note U.S. Pat. No. 4,588,336. The joint of this invention, being in effect an extension of the rails 12/12a, is also provided with corresponding rack teeth, shown at 80.

What is claimed is:

1. Coupling member comprising:
   a hexahedron body having a cavity and first, second and third faces;
   a lead screw journaled in said body and having a threaded portion projecting from said body outwardly beyond said first face;
   a worm gear fixedly secured to said lead screw;
   a worm journaled in said body, emerging from said body at said second face adjacent to said first face, and meshing with said gear to provide means for rotating said lead screw;

an access opening communicating with said cavity through said third face adjacent to said first and second faces; and a cover plate secured over said opening.

2. Coupling member in accordance with claim 1, wherein:

said body has a socket formed in an exterior surface thereof, aligned with said worm; and said worm projects outwardly into said socket, the outer end of said worm stopping short of said surface.

3. Coupling member in accordance with claim 2, wherein:

said outer end is formed as a non-circular head adapted to receive a socket wrench for rotating said worm.

4. Joint for coupling a pair of elongate members in alignment, comprising:

a body having an axis;

a pair of oppositely disposed lead screws, each having a threaded portion projecting outwardly of said body on said axis, the inner ends of said screws being in butting relation and forming respective thrust bearings for the screws;

each lead screw having a worm gear fixed thereto, adjacent the inner end thereof;

the face of the hub of said gear facing toward said threaded portion butting against a portion of said body and forming a thrust bearing for the respective lead screw;

a pair of worms journaled in said body and meshing with respective said worm gears to provide means for rotating respective said lead screws.

5. A rail assembly comprising:

a pair of aligned rails;

a coupling joint intermediate said rails and comprising:

a body;

a pair of lead screws journaled in said body in alignment with said rails, each having a threaded portion projecting from said body;

each said rail having a tapped bore receiving the threaded portion of the respective lead screw;

each screw having a worm gear fixed thereto;

a pair of worms journaled in said body and meshing with respective said worm gears to provide means for rotating the respective said lead screw; and dowel and socket means for preventing relative rotation between said body and said rails.

* * * * *